United States Patent [19]

Brjukhnevich et al.

[11] 4,282,427
[45] Aug. 4, 1981

[54] ELECTROOPTICAL CAMERA FOR REGISTERING HIGH-SPEED PROCESSES

[76] Inventors: Gennady I. Brjukhnevich, prospekt Vernadskogo, 66, kv. 16; Anatoly F. Klepov, Nagatinskaya ulitsa, 29, korpus 3, kv. 26; Lidia I. Kondrashova, Profsojuznaya ulitsa, 115, kv. 39; Valery I. Lozovoi, Orekhovy bulvar, 37, korpus 2, kv. 312; Viktor A. Miller, Aviatsionnaya ulitsa, 74, korpus 4, kv. 80; Valdis E. Postovalov, ulitsa Krasnodarskaya, 57 korpus 1, kv. 61; Alexandr M. Prokhorov, Zvenigorodskaya ulitsa, 4, kv. 10; Jury N. Serdjuchenko, Yasenevo, 2 Mikroraion, korpus 3, kv. 449; Boris M. Stepanov, Leninsky prospekt, 57, kv. 34; Mikhail Y. Schelev, ulitsa Chkalova, 12/7, kv. 17, all of Moscow, U.S.S.R.

[21] Appl. No.: 26,244

[22] Filed: Apr. 2, 1979

[30] Foreign Application Priority Data

May 16, 1978 [SU] U.S.S.R. .............................. 2615351

[51] Int. Cl.³ .......................................... H01J 31/50
[52] U.S. Cl. ............................. 250/213 VT; 315/360
[58] Field of Search .................. 250/213 R, 213 VT; 313/99; 315/360

[56] References Cited

U.S. PATENT DOCUMENTS

| | | |
|---|---|---|
| 3,903,451 | 9/1975 | Hall et al. ..................... 250/213 VT |
| 3,984,728 | 10/1976 | Orlando et al. ...................... 315/360 |
| 4,071,752 | 1/1978 | Manning ....................... 250/213 VT |

*Primary Examiner*—David C. Nelms

[57] ABSTRACT

An electrooptical camera comprises an image intensifier connected to a control system for gate and scanning, which system includes a serial arrangement of a trigger oscillator, a master oscillator and an amplifier unit, which comprises preamplifiers and output amplifiers for the gate and scanning channels. The trigger oscillator is a relaxation oscillator utilizing an avalanche transistor and a storage capacitor in its collector circuit. The master oscillator is a Marx oscillator with an optical input and with cable line timing sections of different lengths in its collector circuits. The output amplifier of the gate channel is coupled to the gate system of the image intensifier. The output amplifier of the scanning channel is electrically coupled, via integrators, to a load in the form of a wide-band two-channel cable transformer/shaper, which is coupled to the deflection system of the image intensifier. The integrators utilize RLC-elements and can be inserted between the output amplifier of the scanning channel and its load, via a scanning time selector which includes sealed terminals.

8 Claims, 5 Drawing Figures

ELECTROOPTICAL CAMERA FOR REGISTERING HIGH-SPEED PROCESSES

FIELD OF THE INVENTION

The invention relates to data processing/measuring complexes for experimental work in physics, and more particularly to an electrooptical camera for registering high-speed processes. The invention can find use in experimental work relating to laser diagnostics and laser plasma techniques.

The invention is preferably concerned with the registration of single-shot high-speed processes having a picosecond time resolution.

DESCRIPTION OF THE PRIOR ART

Known in the art is an electrooptical camera which can register high-speed processes in a linear scanning mode with a time resolution of about 10 picoseconds.

In this camera, electron-tube circuits are employed to control the gate and scanning means, with the result that one cannot achieve linear scanning speeds exceeding $10^{10}$ cm/s sufficient for a time resolution better than 10 picoseconds.

The time resolution better than 10 picoseconds is achieved in the known circuits utilizing krytrons which, however, offer unstable operation and short service life, which leads to a considerable decrease in their reliability.

Moreover, the described circuits can utilize only thoroughly selected krytrons so as to provide for the desired specification.

Thus, the above-mentioned cameras offer poor reliability in registering high-speed processes of a picosecond time resolution.

There is another electrooptical camera for registering high-speed processes, which camera includes an image intensifier connected to a gate/scanning control system, said system comprises a gate pulse oscillator and a symmetric scan pulse oscillator each having integrators at their outputs.

Each oscillator utilizes a circuit comprising a plurality of serially connected avalanche transistors, while the integrators connected to the outputs of the symmetric scan pulse oscillator include RC-elements (cf. TSN-504 Image-converter Microchannel Streak Camera, Thomson-CSF, DASI Booklet No. 2341/7/74/500, Paris, 1974).

In this camera, symmetric pulses generated at the outputs of the scan oscillator feature poor stability. Indeed, that oscillator fails when one of its transistors, connected serially and maintained under a high potential, changes its internal resistance or undergoes a breakdown. This also influences the reliability of generation of the pulses of the gate pulse oscillator. In addition, there are two following factors which tend to decrease the reliability of formation of the scan pulses: it is practically impossible to select a great number of avalanche transistors to be inserted in the arms of the scan oscillator so that they could give equal, in the order of units of percent, avalanche breakdown voltages across the arms; it is very difficult to obtain integrators which could provide identical parameters of their output signals.

Since a great number of avalanche transistors is present and the discrete components of the scan oscillator are responsible, therefore, for spurious inductances and capacitances, it is impossible to obtain the leading edge of the scan pulse shorter than 2-3 nanoseconds. This imposes a certain limitation on the scanning speed which does not exceed $3 \times 10^9$ cm/s in this case, with the result that the time resolution amounts to 5 picoseconds only.

The disadvantages of the known camera decrease the reliability of recording single-shot high-speed processes which possess a picosecond time resolution.

SUMMARY OF THE INVENTION

An object of the invention is to provide an electrooptical camera in which symmetric scan pulses are formed with a higher stability and reliability.

Another object of the invention is to provide a scanning speed which ensures a time resolution of the camera better than 5 picoseconds.

Yet another object of the invention is to reduce the number of components of which the gate/scanning control system is comprised.

There is disclosed an electrooptical camera for registering high-speed processes, comprising an image intensifier connected to a gate/scanning control system which has integrators, said gate/scanning control system comprises, according to the invention, a trigger oscillator, a master oscillator, and an amplifier unit having preamplifiers for gate and scanning channels, and having output amplifiers for the gate and scanning channels, the trigger oscillator being a relexation oscillator utilizing an avalanche transistor and a storage capacitor in its collector circuit, the output of the trigger oscillator being coupled to the input of the master oscillator which has an optical input for direct triggering of it by the radiation being registered, said master oscillator being a Marx oscillator provided with cable line timing sections of a variable length in its collector circuit, the output of the master oscillator being coupled to the inputs of the preamplifiers whose outputs connect wide-band cable inverters coupled to the output amplifiers of respective gate and scanning channels, the output amplifier of the scanning channel being coupled, via the integrators, to a load which is constituted by a wide-band two-channel cable transformer/shaper producing positive and negative scan pulses and coupled to a deflection system of the image intensifier, the integrators utilizing RLC-elements and being able to be inserted between the output amplifier of the scanning channel and its load via a scanning time selector which utilizes sealed terminals.

DESCRIPTION OF THE INVENTION

The invention will now be described in more detail, by way of example, with reference to the accompanying drawings, in which.

Figure 1:
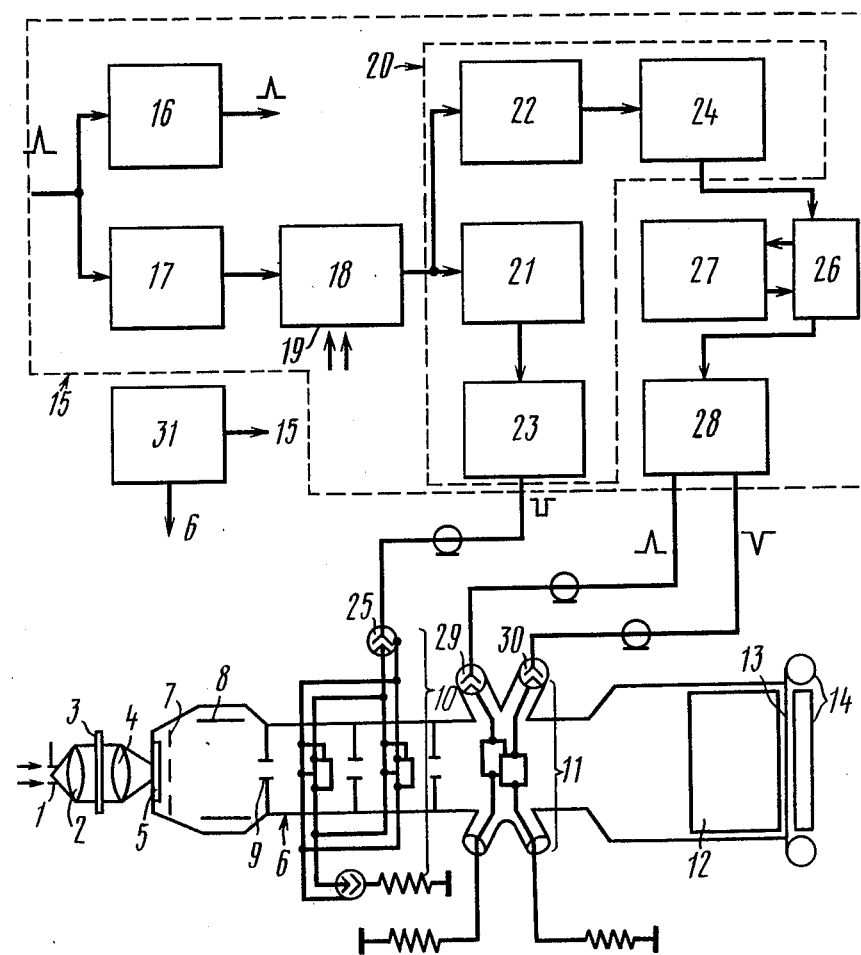
FIG. 1 is a block diagram of an electrooptical camera for registering high-speed processes, according to the invention.

The electrooptical camera for registering high-speed processes comprises an optical system converting the radiation being registered, which system includes a serial arrangement of the components disposed in the direction of the radiation beam as follows: an entrance slit 1 (FIG. 1), an input objective 2, neutral light filters 3, and an output objective 4 with which the radiation beam is focused on to a photocathode 5 of an image intensifier 6.

The evacuated tube envelope of the image intensifier 6 accommodates a serial arrangement of an accelerating grid 7, a focusing system 8, a crossover member (anode diaphragm) 9, a gate system 10, a deflection system 11, an amplification system 12, a viewing screen 13, and a photographic attachment 14.

A system 15 to control the gate and scanning means comprises a sync pulse oscillator 16, a trigger oscillator 17, a master oscillator 18 which has an optical input 19 for direct triggering of it by the radiation being registered, and an amplifier unit 20.

Connected to the electric input of the master oscillator 18 is the output of the trigger oscillator 17.

The amplifier unit 20 comprises a preamplifier 21 of the gate channel and a preamplifier 22 of the scanning channel, said preamplifiers having their inputs coupled to the output of the master oscillator 18, and also comprises an output amplifier 23 of the gate channel and an output amplifier 24 of the scanning channel, said output amplifiers having their inputs coupled to the outputs of the preamplifiers 21, 22.

The output amplifier 23 has its output coupled, via a connector 25, to the gate system 10 of the image intensifier 6.

The output amplifier 24 has its output coupled, via a scanning time selector 26 and via integrators 27, to a load which is a wide-band two-channel cable transformer/shaper 28 designed to produce positive and negative scan pulses.

The outputs of the transformer/shaper 28 are coupled, via connectors 29, 30, to the deflection system 11 of the image intensifier 6.

A power supply unit 31 is coupled to the units of the gate/scanning control system 15 and to the image intensifier 6.

Figure 2:
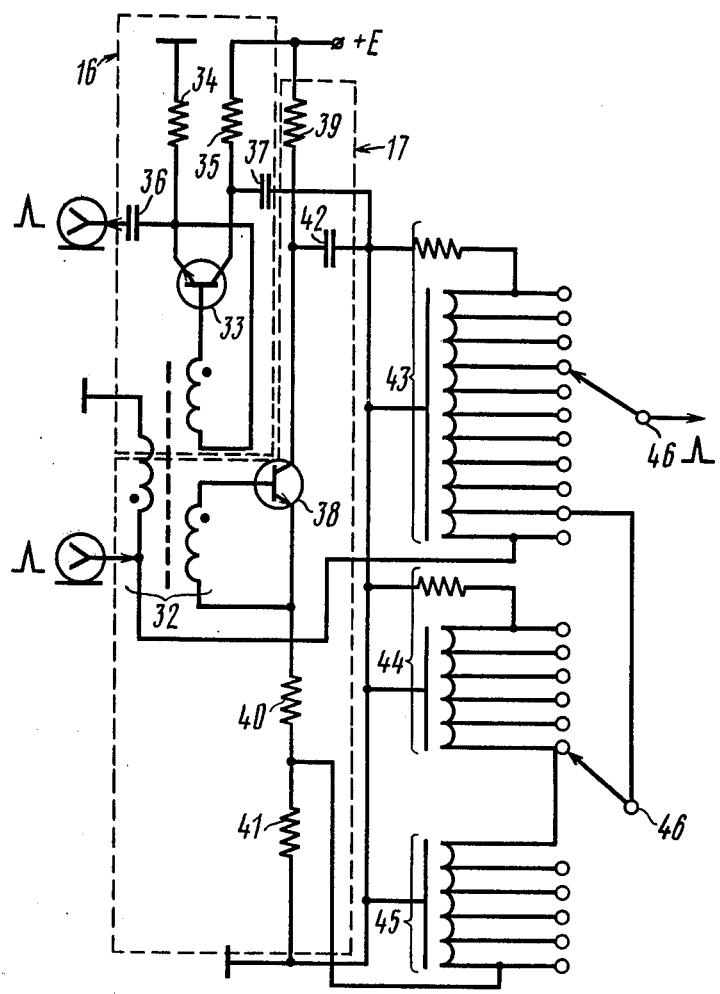
FIG. 2 is a circuit diagram of a sync pulse oscillator and a trigger oscillator having components to connect it to other units of a gate/scanning control system, according to the invention.

There is an input transformer 32 coupled to the inputs of the oscillators 16, 17 (FIG. 2).

The sync pulse oscillator 16 is a relaxation oscillator built around an avalanche transistor 33, resistors 34, 35, an output blocking capacitor 36, and a storage capacitor 37 in the collector circuit of the transistor 33.

The trigger oscillator 17 is a relaxation oscillator using an avalanche transistor 38, a resistor 39, resistors 40, 41 that constitute a divider, and a storage capacitor 42 in the collector circuit of the transistor 38.

Figure 3:
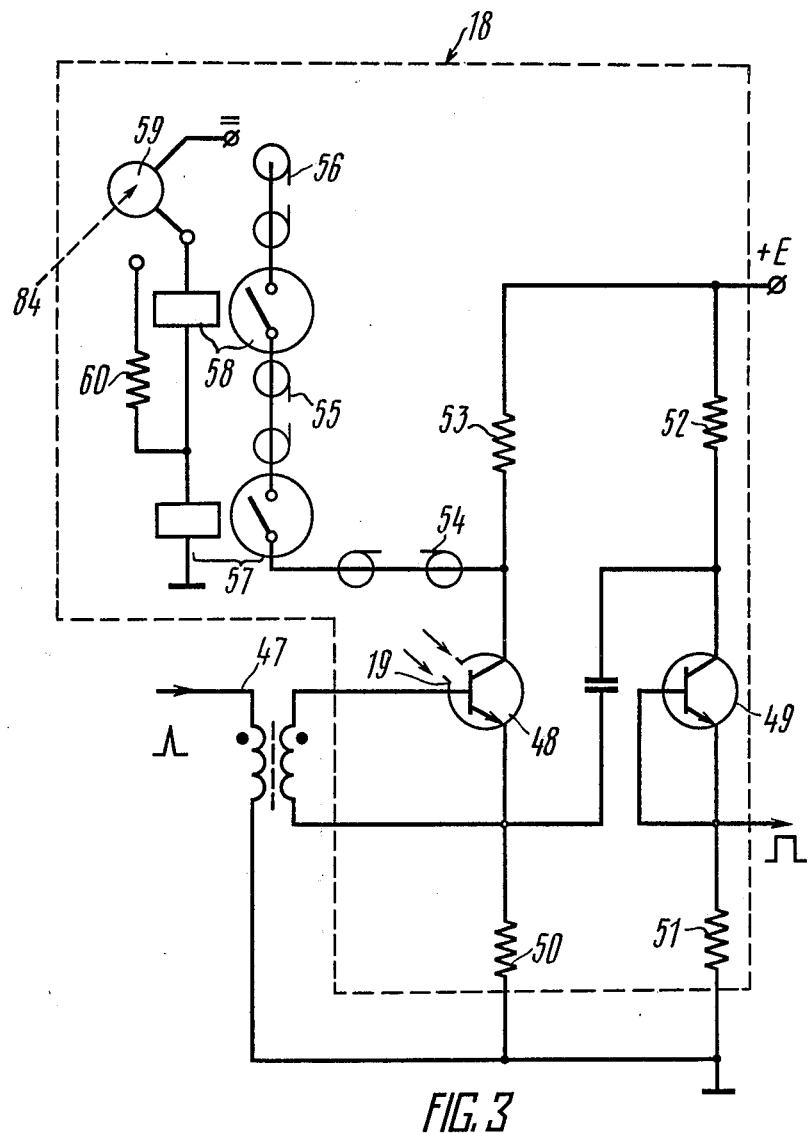
FIG. 3 is a circuit diagram of a master oscillator of the gate/scanning control system, having components to connect it to other units of the system, according to the invention.

The output of the trigger oscillator 17 is electrically coupled, via delay lines 43, 44, 45, via a switch 46 and a pulsed transformer 47 (FIG. 3), to the input of the master oscillator 18 which is a Marx oscillator which includes transistors 48, 49 and resistors 50, 51, 52, 53.

Inserted in the collector circuit of the master oscillator 18 are cable line timing sections 54, 55, 56 of a variable length, which are connected by means of sealed terminals 57, 58 and of a switch 59 having one of its terminals coupled to the windings of the sealed terminals 57, 58 via a ballast resistor 60.

A transistor 48 of the master oscillator 18 has an optical input 19 to provide for direct triggering of the circuit by the radiation being registered.

Figure 4:
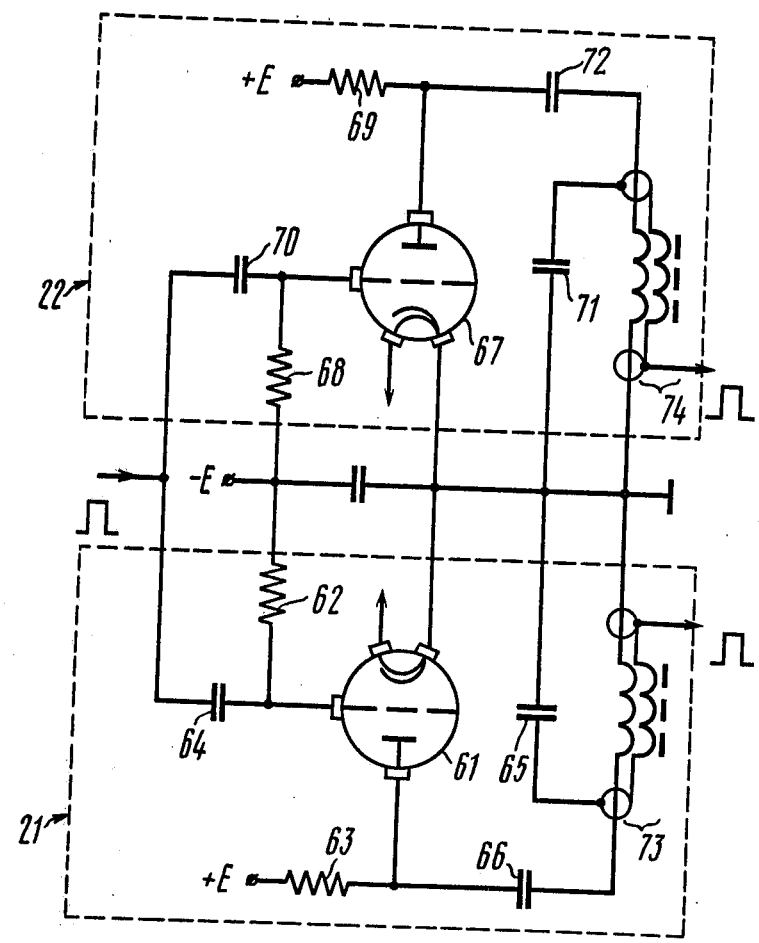
FIG. 4 is a circuit diagram of preamplifiers of the gate and scanning channels of the gate/scanning control system, according to the invention.

The output of a transistor 49 of the master oscillator 18 is coupled to the inputs of the preamplifiers 21, 22 (FIG. 4) of the gate and scanning channels, utilizing common-cathode resistive stages.

The preamplifier 21 employs a tube 61, resistors 62, 63 and capacitors 64, 65, and 66.

The preamplifier 22 includes an electron tube 67, resistors 68, 69 and capacitors 70, 71, 72.

Coupled to the outputs of the preamplifiers 21, 22 are wide-band cable inverters 73, 74 respectively.

Figure 5:
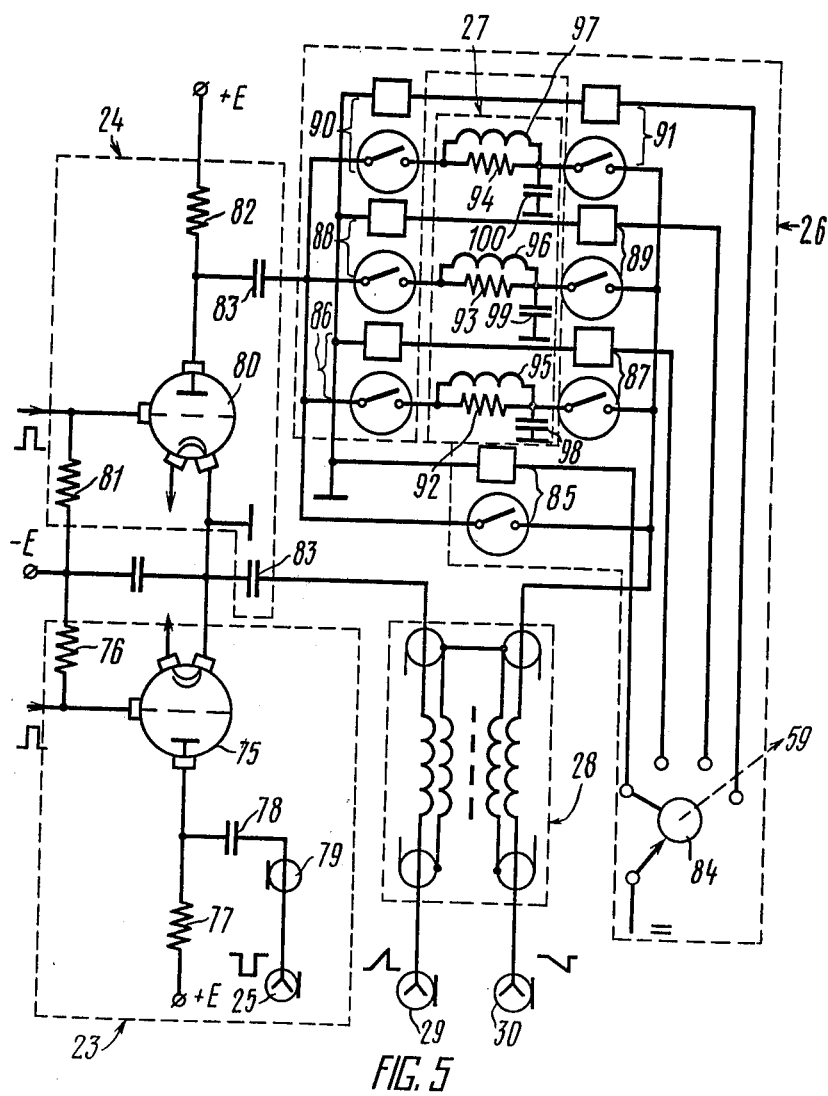
FIG. 5 is a circuit diagram of output amplifiers of the gate and scanning channels, integrators, scanning time selector, and wide-band two-channel cable transformer/shaper of the gate/scanning control system, according to the invention.

The outputs of the inverters 73, 74 are coupled to the inputs of the output amplifiers 23, 24 (FIG. 5), respectively, which utilize common-cathode resistive stages.

The output amplifier 23 includes an electron tube 75, resistors 76, 77, a capacitor 78, and works into a matched line 79. Connected across an open connector 25 of the matched line 79 is the gate system (FIG. 2) of the image intensifier 6.

The output amplifier 24 (FIG. 5) includes an electron tube 80, resistors 81, 82 and capacitors 83.

The output of the amplifier 24 is electrically connected, via the scanning time selector 26 and via the integrators 27, to a load which is a wide-band two-channel cable transformer/shaper 28 producing positive and negative scan pulses, said transformer/shaper 28 having its outputs coupled, via connectors 29, 30, to the deflection system 11 (FIG. 1) of the image intensifier 6.

The scanning time selector (FIG. 5) comprises a switch 84 joined to the switch 59 (FIG. 3) and sealed terminals 85 (FIG. 5), 86, 87, 88, 89, 90, 91.

The integrators 27 utilize RLC-elements comprised of resistors 92, 93, 94, inductor coils 95, 96, 97 and capacitors 98, 99, 100, and can be inserted between the output amplifier 24 and its load, using respective sealed terminals 85, 86, 87, 88, 89, 90, 91 and the switch 84.

The electrooptical camera of the invention operates in the following manner.

The radiation beam to be registered impinges on the entrance slit 1 (FIG. 1) and an image of the latter, produced by the objectives 2, 4, is projected on to the photocathode 5 of the image intensifier 6.

When leaving the photocathode 5, the electrons are accelerated by the grid 7 and are passed through the focusing system 8, crossover 9, gate system 10, and deflection system 11.

After amplification in the system 12, the electron beam is incident on the viewing screen 13 where the electrons are converted to an optical image beam which is recorded on a film by means of the photographic attachment.

A portion of the radiation being registered impinges on the optical input 19 to provide for direct triggering of the master oscillator 18.

Triggering by an electric pulse is as follows. A pulse is applied, via the input transformer 32 (FIG. 2), to the bases of the avalanche transistors 33, 38 of the sync pulse generator 16 and the trigger generator 17, respectively.

A sync pulse available from the load resistor 34 is applied to external devices (not shown) to effect their triggering.

The pulse produced by the transistor 38 is applied, via the divider comprised of the resistors 40, 41, delay lines 43, 44, 45 and pulsed transformer 47 (FIG. 3), to the base of the transistor 48 of the master oscillator 18 so as to trigger the latter.

The master oscillator 18, utilizing a Marx circuit, produces square pulses whose width is controlled by inserting the timing sections 54, 55, 56, which is accomplished by switching the sealed terminals 57, 58.

The switch 59 is operated to control the windings of the sealed terminals 57, 58.

A square pulse produced by the master oscillator 18 is passed through the resistor 51 in the emitter circuit of the transistor 49 and through the blocking capacitors 64, 70 (FIG. 4) and is then applied to the grids of the tubes 61, 67 of the preamplifiers 21, 22, respectively.

The amplified square pulses obtainable from the anodes of the tubes 61, 67 are applied, via the blocking capacitors 66, 72 and the inverters 73, 74, respectively, to the grids of the tubes 75 (FIG. 5) 80 of the output amplifiers 23, 24, respectively.

The pulses amplified to a level necessary for the gate to be controlled are obtainable from the anode of the tube 75 and are applied, via the blocking capacitor 78, matched line 79 and connector 25, to the gate system 10 (FIG. 1) of the image intensifier 6.

The scan pulses of negative and positive polarity are formed from a pulse, that passes from the anode of the tube 80 (FIG. 5), by means of the transformer/shaper 28 comprised of two cable pieces. The latter connect each other in series, as related to the tube 80, one of the cable pieces connecting the anode of the tube 80 via the scanning time selector 26, the integrators 27, and the capacitor 83, and the other cable piece connecting the cathode of the tube 80 via the capacitor 83.

As a result, the outputs of the transformer/shaper 28 produce scan pulses of opposite polarity and identical amplitude.

The design of the transformer/shaper 28 allows for a lossless conversion of the energy of the pulse provided by the output amplifier 24 of the scanning channel into two heteropolar pulses of a half-amplitude.

In addition, two independent matched outputs allow for easy connection, via the connectors 29, 30 to the deflection system 11 (FIG. 1) of the image intensifier 6.

To provide for saw-tooth configuration of the output scan pulse, it is passed via a respective RLC-circuit of the integrators 27 which has its characteristics corresponding to the desired scanning time.

To select a scanning time, the sealed terminals 85, 86, 87, 88, 89, 90, 91 are operated by the switch 84.

The electrooptical camera of the invention is applicable to experimental work on laser diagnostics and laser plasma and, preferably, for registering single-shot high-speed processes having a picosecond resolution time. These processes can be registered reliably due to the fact that symmetric heteropolar scan pulses can be formed on a stable basis and that the scanning speed can be increased up to a level providing for a time resolution of the camera better than 5 picoseconds.

What is claimed is:

1. An electrooptical camera for registering high-speed processes represented by beams of radiation, comprising:
  an image intensifier having an evacuated tube envelope, a gate system and a deflection system within said evacuated tube envelope to control the beam of radiation within said image intensifier;
  control means connected to said gate and deflection systems for controlling said systems, said control means including
  a trigger oscillator having input means for accepting an electric trigger pulse,
  a master oscillator connected to said trigger oscillator and having an optical input to provide for direct triggering of said master oscillator by the beam of radiation being registered,
  first amplification means including first inverter means and connected between said master oscillator and said gate system for driving said gate system responsive to output signals from said master oscillator,
  second amplification means including second inverter means and having an input connected to said master oscillator;
  a transformer/shaper which serves as a load to said second amplifying means and is connected to said deflection system for providing positive and negative scan pulses to said deflection system;
  integrators insertable between said second amplifying means and said transformer/shaper; and
  a scanning time selector for selectively inserting said integrators between said second amplifying means and said transformer/shaper to provide desired scanning times for said deflection system.

2. An electrooptical camera as defined in claim 1, wherein said trigger oscillator comprises an avalanche transistor arranged in a relaxation oscillator configuration, said avalanche transistor having a collector circuit including a storage capacitor.

3. An electrooptical camera as defined in claim 1, wherein said master oscillator generates generally square pulses and wherein said master oscillator comprises a Marx oscillator having a collector circuit, and a plurality of cable line timing sections selectively insertable into said collector circuit to select the width of said square pulses.

4. An electrooptical camera as defined in claim 1, wherein said first amplification means comprises a pre-amplifier and an output amplifier, and a wide-band inverter connected between said pre-amplifier and said output amplifier.

5. An electrooptical camera as defined in claim 4, wherein said wide-band inverter is a cable inverter.

6. An electrooptical camera as defined in claim 1, wherein said second amplifier means comprises a pre-amplifier and an output amplifier, and a wide-band inverter connected between said pre-amplifier and said output amplifier.

7. An electrooptical camera as defined in claim 1, wherein said transformer/shaper comprises a wide-band two-channel cable.

8. An electrooptical camera as defined in claim 1, wherein said integrator comprise RLC elements.

* * * * *